United States Patent [19]

Pfeifer et al.

[11] Patent Number: 4,675,255
[45] Date of Patent: Jun. 23, 1987

[54] BATTERY POLE TERMINAL WITH CURRENT SENSOR

[75] Inventors: Thomas Pfeifer, Eppstein; Ivan Grgec-Messner, Kelkheim-Fischbach, both of Fed. Rep. of Germany

[73] Assignee: VDO Adolf Schindling AG, Frankfurt am Main, Fed. Rep. of Germany

[21] Appl. No.: 905,725

[22] Filed: Sep. 9, 1986

[30] Foreign Application Priority Data

Sep. 9, 1985 [DE] Fed. Rep. of Germany ....... 3532044

[51] Int. Cl.⁴ .......................................... H01M 10/48
[52] U.S. Cl. ................................. 429/92; 324/117 H; 324/126
[58] Field of Search ...................... 429/92, 90, 91, 93, 429/121; 324/117 H, 117 R, 126, 127, 426, 427, 428, 429

[56] References Cited

U.S. PATENT DOCUMENTS

| 2,181,182 | 8/1937 | Gogaen et al. | 429/93 |
| 3,166,650 | 1/1965 | Heidrich | 324/426 |
| 3,345,491 | 10/1967 | Badger et al. | 324/426 |
| 3,594,642 | 2/1969 | Wright | 324/426 |
| 3,657,650 | 4/1972 | Arndt | 324/126 |
| 4,247,811 | 1/1981 | Findl | 429/93 |
| 4,329,406 | 5/1982 | Dahl et al. | 429/92 |
| 4,513,246 | 4/1985 | Blain | 324/127 |

FOREIGN PATENT DOCUMENTS

| 500767 | 3/1954 | Canada | 429/93 |
| 289993 | 5/1928 | United Kingdom | 429/93 |

Primary Examiner—Brian E. Hearn
Assistant Examiner—Steven Marquis
Attorney, Agent, or Firm—Martin A. Farber

[57] ABSTRACT

A pole terminal is formed as an intermediate piece and has toward the bottom a clamping piece for fastening to a conventional battery pole and toward the top a pole body to which a conventional battery terminal can be fastened. In the pole terminal there are a Hall element and an evaluation electronics so that the current flow through the pole body can be measured.

9 Claims, 5 Drawing Figures

BATTERY POLE TERMINAL WITH CURRENT SENSOR

FIELD AND BACKGROUND OF THE INVENTION

The invention relates to a pole terminal for storage batteries and, more particularly, to a clamp-on integrally formed terminal and current measurement circuit having connections for a display or measuring device.

In motor vehicles equipped with storage batteries, conventionally pole terminals of electric power cables are set on the poles of the storage batteries in order to connect the poles with the electric power cable of the motor vehicle. The pole terminals are formed of shells which can be clamped tightly by means of clamping screw to the respective poles.

During charging of storage batteries it is necessary to measure the current flowing through the poles in order to determine when charging is completed for disconnecting the charging device at the proper time. Futhermore, it is desirable during use of a storage battery to be able to monitor its charge condition in order not to discharge the storage battery excessively, for example by using an auto radio, such that too little current may be available for a starting operation of the vehicle. Such a monitoring requires a connection, possibly on a pole terminal, for a connection cable of a display or measuring device. For the connection of the necessary cable it is known to provide additional connections on the pole terminal which connects the storage battery with the power supply cable.

If a battery is charged outside of the vehicle, then the pole terminals are to be loosened first from the battery. During charging, consequently, one employs a provisional connection of a display or measuring device.

SUMMARY OF THE INVENTION

It is an object of the invention to provide a pole terminal such that a display or measuring device reliably can be connected to the pole terminal without separation of the storage battery from a power supply such as an automotive generator.

According to the present invention the pole terminal is formed as an intermediate part with a pole body (2) for connection to a conventional connection clamp secured to a battery cable, the pole body being formed in correspondence with the configuration of the battery pole. The pole body (2) has a current sensor for detecting current flowing through the battery pole.

By virtue of the foregoing construction of the invention, the pole terminal continuously remains fastened on the pole of the storage battery. The cable connecting the battery with the power supply cable can be fastened by a pole terminal clamp of conventional design to the pole terminal in accordance with the invention. In this way, a display or measuring device can be connected to the battery independently of whether the battery is connected with the power supply cable or not. Consequently a monitoring of current in a battery which is disconnected from the power supply cable as well as a monitoring during the operation of a vehicle with the battery connected are possible.

From a construction viewpoint it is particularly advantageous to provide the pole body (2) for the connection terminal with a clamping piece (3) for fastening the pole terminal to a battery pole. Such an embodiment of the invention enables one to mount and tightly screw the conventional pole terminal, which is provided with a connection cable, from the top on the pole terminal.

Preferably, the pole body (2) and the clamping piece (3) are arranged coaxially with respect to each other. Connections (13-16) for a display or measuring device are provided on a housing (6) which is secured to the pole body (2).

Measurement current flowing through the battery pole is facilitated by encircling the pole body (2) with an annular core (9) having a radial gap (11). A holding element (12) which holds a current sensor is located in the gap for sensing a magnetic field induced in the core by the current to output a signal indicating strength of the current. The current sensor is readily constructed of a Hall device. The annular core (9) may be held by a flange (8) which encircles the pole body (2).

A housing (6) may be formed about the annular core (9) and, if desired, about the flange (8), this arrangement providing a secure encapsulation for protection of these parts from the outside environment.

The need for an external evaluation electric circuit, located outside of a pole terminal, can be eliminated by locating, in the housing (6), an evaluation electronics circuit (7) for processing the Hall voltage of the Hall device (12).

The above described formation of the pole terminal has the advantage of ensuring a galvanic separation of the evaluation electronics from the pole terminal.

BRIEF DESCRIPTION OF THE DRAWINGS

With the above and other objects and advantages in view, the present invention will become more clearly understood in connection with the detailed description of a preferred embodiment, when considered with the following accompanying drawings, wherein.

DETAILED DESCRIPTION OF THE PREFERRED EMBODIMENT

Figure 1:
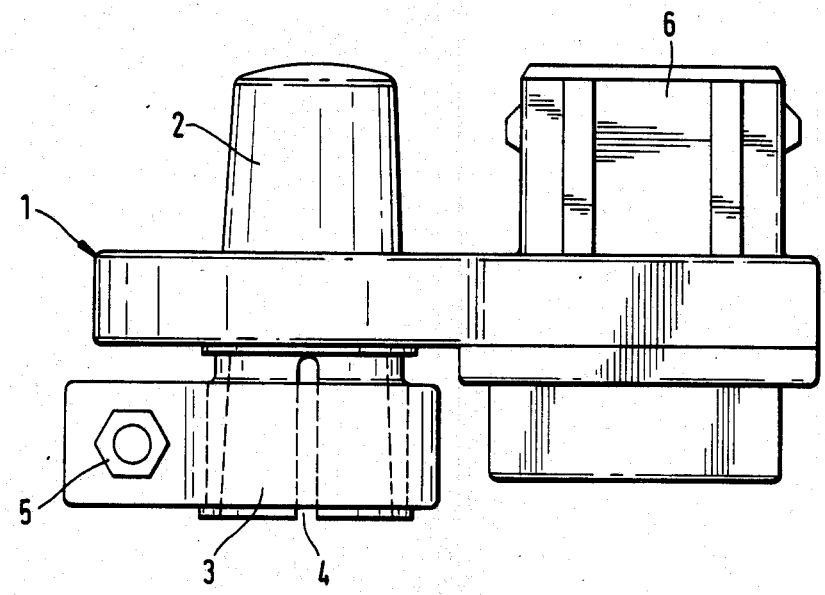
FIG. 1 is a side view of a pole terminal incorporating the invention.

As shown in FIG. 1 the pole terminal comprises a synthetic or plastic body 1 from which there projects upwardly a pole body 2 made of electrically conducting material. The pole body 2 is configured with the same outer form as a conventional battery pole so as to receive a conventional connection terminal which can be clamped on the pole body 2. The connection terminal connects a storage battery with a supply cable (not shown). Coaxial to the pole body 2 there projects downwardly from the synthetic body 1 a clamp piece 3 which has a slot 4 which enables the pole terminal to be pushed on a conventional battery pole. By means of a clamping screw 5 the clamping piece 3 can be tightened about and held on the battery pole. Laterally of the pole body 2 and of the clamping piece 3, the plastic body 1 is connected with a closed housing 6 in which an evaluation electronic circuit 7 (indicated diagrammatically in by a block in FIG. 3) is enclosed.

Figure 2:
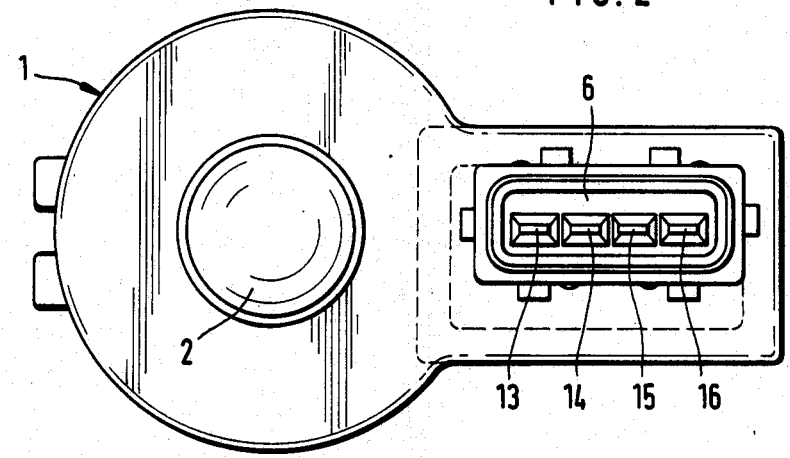
FIG. 2 is a partially broken away plan view of the pole terminal according to FIG. 1.
Figure 3:
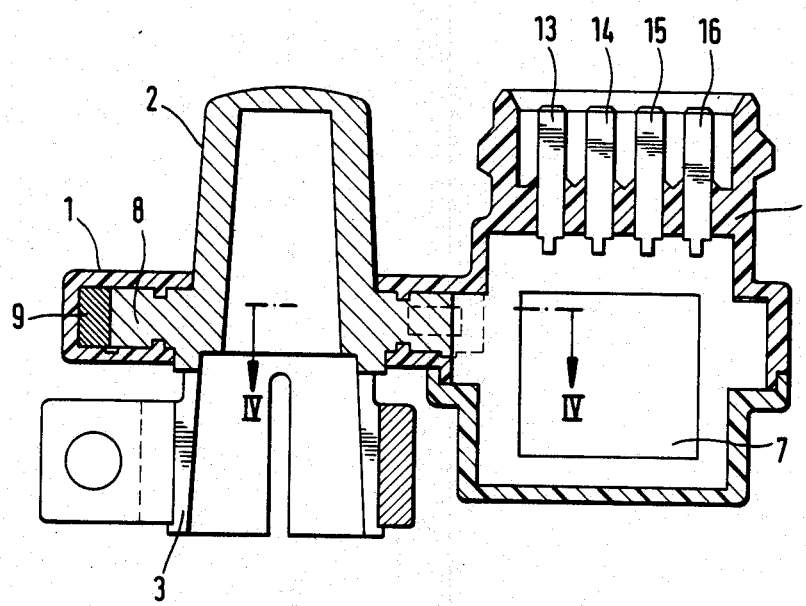
FIG. 3 is a vertical section through the pole terminal of FIGS. 1 and 2.

The plan view of FIG. 2 shows the arrangement of the above-mentioned components of the terminal of FIG. 1. FIG. 3 shows the inner construction of the pole clamp. It may be seen that the pole body 2 has a radially encircling flange 8. The flange 8 is encircled by an annular core 9 such that the annular core 9 and the flange 8 are enclosed by the plastic body.

Figure 4:
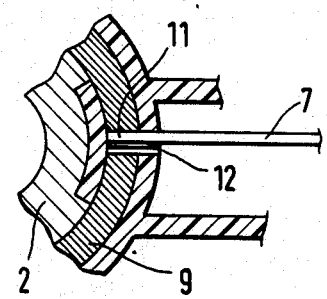
FIG. 4 is a horizontal partial view along the lines IV—IV in FIG. 3.

As recognized from FIG. 4 the annular core 9 has a gap 11 in which a holding element 12 (current sensor) is disposed. The holding element 12 connects with the evaluation circuit 7 for measurement of the current which flows through the pole body 2. In FIG. 3 the illustrated connections 13–16 on the housing 6 allow use of the evaluation circuit 7, for example, with an indicating instrument (not shown) which has the capability to indicate the current flow through the pole body 2. Alternatively, the evaluation circuit may be connected to an electronic circuit (not shown) for control of battery charging or other functions.

Figure 5:
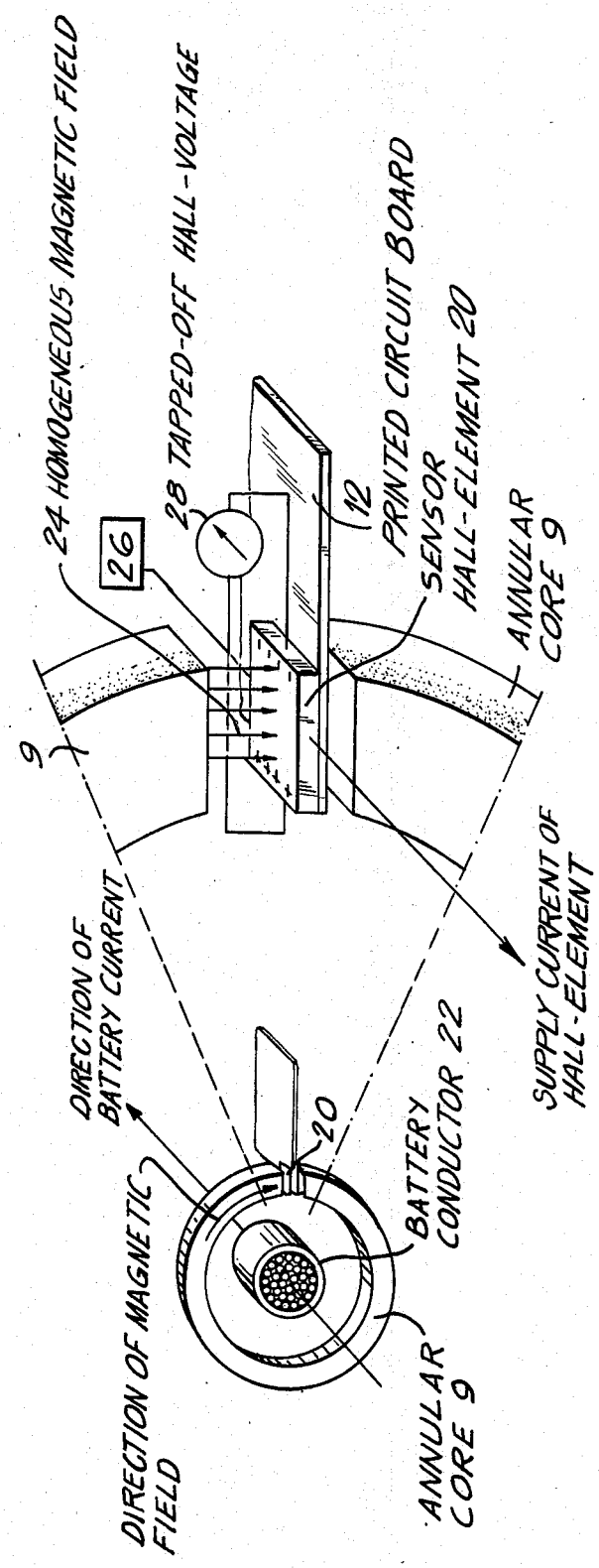
FIG. 5 is a stylized perspective view showing the operation of a current sensor, such as a Hall device, formed within the pole terminal.

FIG. 5 shows emplacement of a sensor 20, constructed as a Hall device, within the holding element 12, and an enlarged view of the sensor 20 to demonstrate operation of the invention. The battery pole is represented by a section of an electrical conductor 22 encircled by the annular core 9. The sensor 20 is located within the gap 11 of the core 9, and is configured with a generally planar configuration perpendicular to the lines 24 of a magnetic field induced in the core 9 by battery current flowing in the conductor 22. Upon application of a well-known bias voltage from a voltage source 26 across ends of the sensor 20, a Hall voltage appears across sides of the sensor 20. The Hall voltage is proportional to the battery current flowing through the conductor 22, and is suitable for driving an indicator 28, located externally to the pole terminal and connected via the evaluation circuit (omitted in FIG. 5 but shown in FIG. 3) to the sensor 20. A feature of the invention is the enclosure of the annular core 9 and the sensor 20 within a housing formed as a unitary structure with the pole terminal.

It is to be understood that the above described embodiment of the invention is illustrative only, and that modifications thereof may occur to those skilled in the art. Accordingly, this invention is not to be regarded as limited to the embodiment disclosed herein, but is to be limited only as defined by the appended claims.

We claim:

1. A pole terminal for a storage battery, which has connections for an indicating or measuring device comprising:
   a pole body for connection to a conventional cable connection clamp of a battery cable, the pole body being formed with the configuration of a battery pole; and
   a current sensor located within said pole body for detecting current flowing through the battery pole.

2. The pole terminal as set forth in claim 1, wherein the pole body of the connection terminal has a clamping piece for fastening the pole terminal to a battery pole.

3. The pole terminal as set forth in claim 2, wherein the pole body and the clamping piece are arranged coaxially with respect to each other.

4. The pole terminal as set forth in claim 3, further comprising
   a housing secured to one side of said pole body for support of electronic circuitry; and wherein
   connections for a display or measuring device are provided on said housing.

5. The pole terminal as set forth in claim 3, further comprising
   an annular core which has a radial gap and encircles the pole body, there being a holding element including a current sensor located in the gap.

6. The pole terminal as set forth in claim 5, further comprising a flange encircling the pole body; and wherein
   the annular core encircles the flange of the pole body.

7. The pole terminal as set forth in claim 5, further comprising a housing enclosing the annular core.

8. The pole terminal as set forth in claim 7, wherein said housing encloses said flange.

9. The pole terminal as set forth in claim 5, further comprising a housing secured to one side of said pole body, and an evaluation electronics circuit located for processing a Hall voltage of the current sensor, said current sensor comprising a Hall device.

* * * * *